(12) United States Patent
Petrescu-Prahova

(10) Patent No.: US 7,940,829 B2
(45) Date of Patent: May 10, 2011

(54) LASER DEVICES USING GAIN MEDIA OPERATING IN OUT OF PHASE MODE

(76) Inventor: Lulian Petrescu-Prahova, North Brunswick, NJ (US)

( * ) Notice: Subject to any disclaimer, the term of this patent is extended or adjusted under 35 U.S.C. 154(b) by 99 days.

(21) Appl. No.: 12/227,373

(22) PCT Filed: May 25, 2007

(86) PCT No.: PCT/US2007/012497
§ 371 (c)(1),
(2), (4) Date: Nov. 14, 2008

(87) PCT Pub. No.: WO2007/145797
PCT Pub. Date: Dec. 21, 2007

(65) Prior Publication Data
US 2009/0129425 A1      May 21, 2009

Related U.S. Application Data

(60) Provisional application No. 60/812,241, filed on Jun. 9, 2006, provisional application No. 60/873,189, filed on Dec. 6, 2006.

(51) Int. Cl.
*H01S 3/06*    (2006.01)
*H01S 3/07*    (2006.01)
(52) U.S. Cl. ............ 372/66; 372/92; 372/99; 372/102
(58) Field of Classification Search ............ 372/49.01, 372/66, 92, 93, 96, 98, 99, 101, 102, 108
See application file for complete search history.

(56) References Cited

U.S. PATENT DOCUMENTS

| | | | |
|---|---|---|---|
| 3,308,395 A * | 3/1967 | Sorokin | 372/66 |
| 4,426,705 A | 1/1984 | Stevison et al. | |
| 4,815,094 A * | 3/1989 | Cantoni | 372/93 |
| 4,829,532 A * | 5/1989 | Kane | 372/20 |
| 4,939,738 A | 7/1990 | Opower | |
| 5,651,021 A * | 7/1997 | Richard et al. | 372/92 |
| 6,219,361 B1 * | 4/2001 | Guch et al. | 372/10 |
| 6,418,156 B1 * | 7/2002 | Peressini | 372/66 |
| 6,671,305 B2 * | 12/2003 | Knights et al. | 372/92 |
| 2002/0191662 A1 * | 12/2002 | Perry et al. | 372/66 |
| 2003/0067954 A1 * | 4/2003 | Ouhayoun | 372/102 |
| 2003/0169797 A1 * | 9/2003 | Aldaz et al. | 372/96 |
| 2006/0114961 A1 * | 6/2006 | Manni | 372/70 |
| 2007/0110116 A1 * | 5/2007 | Vetrovec et al. | 372/66 |

FOREIGN PATENT DOCUMENTS
WO    WO2007/145797    12/2007

OTHER PUBLICATIONS
Webster.com (Virtual definition) p. 1, Jul. 16, 2010.*

\* cited by examiner

*Primary Examiner* — Minsun Harvey
*Assistant Examiner* — Delma R Forde
(74) *Attorney, Agent, or Firm* — Thomas R. Vigil

(57) ABSTRACT

The basic gain medium enclosure for laser devices comprises two parallel lateral mirrors which geometrically define the extent of the gain medium enclosure and which allow the formation of lateral stationary sinusoidal waves.

11 Claims, 7 Drawing Sheets

FIG. 6
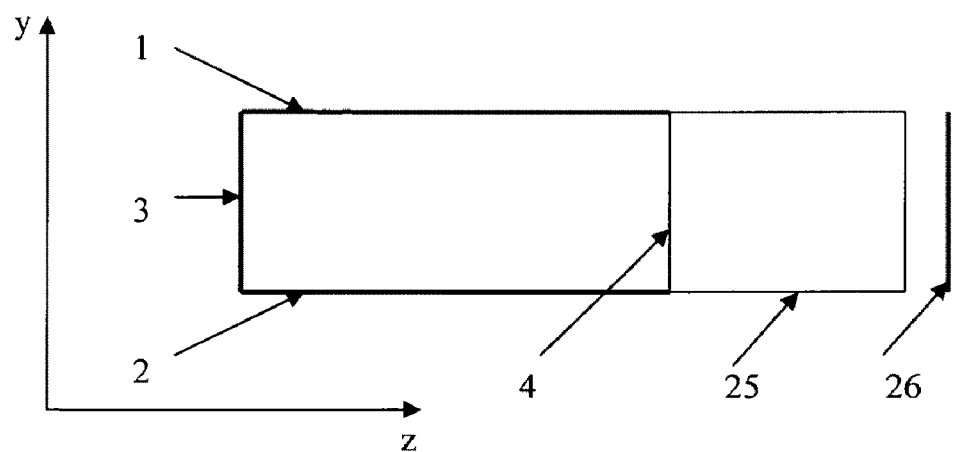
FIG. 7
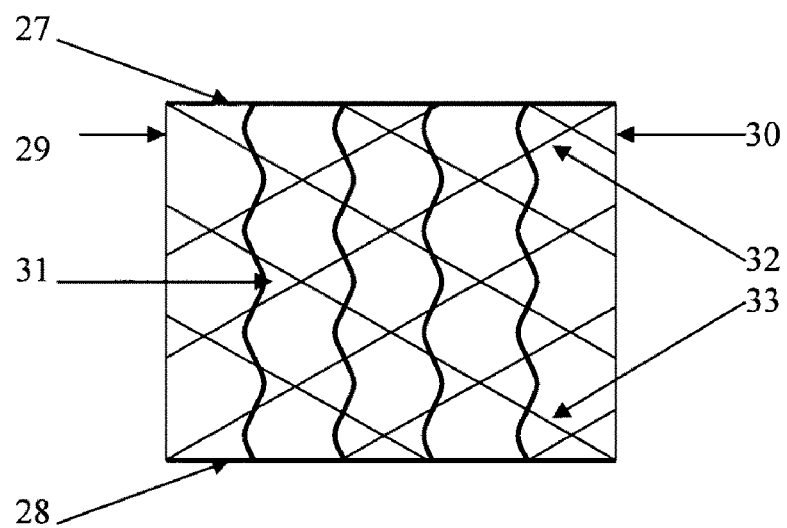
FIG. 8

LASER DEVICES USING GAIN MEDIA OPERATING IN OUT OF PHASE MODE

CROSS REFERENCE TO RELATED APPLICATIONS

This application claims priority from U.S. provisional patent applications No. 60/812,241, filed Sep. 6, 2006, entitled LASER RESONATORS FOR GAIN MEDIA OPERATING IN OUT OF PHASE MODE and No. 60/837,189, filed Jun. 12, 2006 entitled LASER DEVICES WITH GAIN MEDIA IN AND OUT OF PHASE MODE

BACKGROUND OF THE INVENTION

1. Field of the Invention

The present invention relates to a basic gain medium enclosure for laser devices that comprises two parallel lateral mirrors which geometrically define the extent of the gain medium enclosure and which allow the formation of lateral stationary sinusoidal waves.

2. Description of the Prior Art

Most laser resonators consist of two opposite mirrors with light bouncing forth and back in between. The most known resonator with two opposite mirror is the Fabry-Perot resonator, where these mirrors are plane and parallel to each other. The field distribution in a cross section of such a resonator is named the lateral field distribution. For each resonator there is a multitude of lateral field distributions (or configurations), named lateral modes, each characterized by the zeros and maxima of the field intensity. The fundamental mode has no zero in lateral cross section and the field in concentrated toward the axis of propagation. The fundamental mode of the Fabry-Perot resonator for cylindrical shape lasers (rods, fibers, disks) has a Gaussian cylindrical type of lateral field distribution. The gain medium, superimposed over the field distribution, provides the necessary power for laser oscillation in spite of internal or mirror losses.

Array of gain elements are used to multiply the power of laser elemental oscillators. The same intent, to increase the power, is valid for wide single gain elements. Gain and/or array elements are linearly distributed in semiconductor or fiber laser arrays or might further be circularly or lattice distributed in fiber array. Usually the arrays have a larger lateral spatial extent than a single element laser and this further multiply the possible field configurations. Those configurations that have intensity peaks at the gain locations are preferred for oscillations since they have best coupling between the field intensity and the gain and low threshold. Linearly distributed arrays usually are designed (or intended) for the in phase mode of operation, i.e., each intensity peak coupled with a gain element to be in phase with any other peak coupled with gain elements. Nevertheless, most often, arrays oscillate in the out of phase mode, where each intensity peak coupled with a gain element is in out of phase with its adjacent peaks coupled with gain elements.

The field configurations for array are named super-modes. This name came as an extension for the field configuration of a single element, which is a mode. In the week coupling case, the modes of individual elements couple together with different phases, forming the super-mode. In the strong coupling case, the name super-mode looses this semantic sense: the field configuration is holistic, depends on the entire extent of the refractive index profile and might not be spatially correlated with gain positions.

The out of phase super-mode stated above has a field distribution that has a strong sinusoidal component in the near field and two main symmetrical lobes in the far field. Nevertheless, multiple lobes or some background distributed in the angle space accompanies the two main lobes, what reduces the efficiency in the further use of these two main lobes.

SUMMARY OF THE INVENTION

It is an object of this invention to provide devices for the out of phase mode of the laterally distributed field, devices that restrict the near field to a distribution close to the sinusoidal distribution and the far field at only two main diffraction limited lobes.

It is another object of this invention to provide means to recombine the two lobes far field into a single diffraction limited beam.

The device according to the present invention is of long longitudinal spatial extent in one direction, a wide lateral spatial extent in an other perpendicular direction and a restricted transversal spatial extent in a third direction perpendicular on the former two, with uniform lateral and longitudinal distribution of the refractive indexes, such that the radiation propagate in the longitudinal-lateral plane as plane waves; in between its longitudinal and lateral spatial extents, the device has a gain medium; the gain medium is geometrically enclosed by a mirror configuration formed by two lateral mirror at the ends of the lateral spatial extent, such that inclined plane waves that propagate between the two lateral mirrors form pure sinusoidal stationary waves in a lateral cross section.

In one set-up, intended to form a closed optical path, the device has a back mirror at one end of the longitudinal spatial extent a semi-transparent mirror at the second end of the longitudinal spatial extent such that the far field consists of two diffraction-limited lobes.

Mechanisms external to these devices can transform the far field with two diffraction limited lobes into a single diffraction limited lobe.

BRIEF DESCRIPTION OF THE SEVERAL VIEWS OF THE DRAWINGS

FIG. 7 a plan view of a U-shaped mirror configuration with grating coupler and output coupler FIG. 8 is a schematic plan view of a laterally modulated long period grating

DETAILED DESCRIPTION OF THE PREFERRED EMBODIMENTS OF THE INVENTION

The devices according to the invention can be formed in epitaxial structure of a semiconductor laser or in a layered structure of a ribbon laser. A ribbon laser can be made, for example, from glass materials that include gain cores or gain sheets. A ribbon laser can have on one side or both transversal sides, top and bottom, thicker layers for optical pumping. In a fiber analogy, these layers are named claddings. Perpendicular to the layered structure is a transversal direction x. In the plane of the layered structure there is a longitudinal direction z and a lateral direction y. The directions x, y, and z are perpendicular to each other. The transversal extent of the layered structure is spatially limited and the layers give a convex shape to the refractive index profile as a function of the x coordinate. In this refractive index profile only a single transversal field distribution E(x) is favored by the transversal gain and losses distribution. It might be assumed that this field distribution has a single peak and no zeros and that it is the fundamental transversal field distribution.

Basic Elements of the Devices According with the Invention

Figure 1:
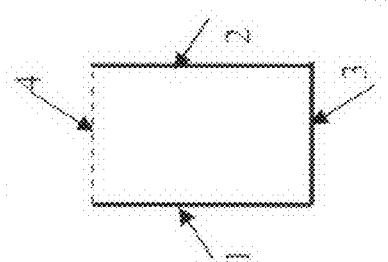
FIG. 1 is a plan view of the basic elements of a U-shaped mirror configuration

FIG. 1 represents a lateral cross section of the basic elements of the devices according with the invention in the y-z plane. The gain medium has a rectangular shape. The refractive index has no dependence on y and z, it is uniform in these directions. The propagation in the y-z direction is characterized by an effective refractive index n. In the lateral cross section the radiation propagate in plane waves of the form:

$$E=E(x)\exp(j(\omega t - k_z z - k_y y)) \quad (1)$$

where $|k|=2\pi n/\lambda$

The rectangular gain medium is enclosed on its sides by two parallel, lateral mirrors 1 and 2 perpendicular to the lateral direction y and separated by a lateral spatial extent w. The two lateral, parallel mirrors geometrically determine the extent of the rectangular enclosure. They form the II shaped mirror configuration. A back mirror 3 perpendicular to the longitudinal direction z might enclose the gain medium on one side of its longitudinal extent in z direction. The II shaped mirror configuration, i.e. mirrors 1 and 2, plus mirror 3 form a U shaped mirror configuration. A virtual input-output boundary 4 closes the ends of the mirror 1 and 2 opposite to the back mirror 3. Boundary 4 is separated by a distance L from the back mirror 3. The mirrors can have a phase shift of 0 or π rad. For most of the further explanations all mirror have a phase shift of π rad, but 0 rad shift is not excluded.

The First Embodiment

Figure 2:
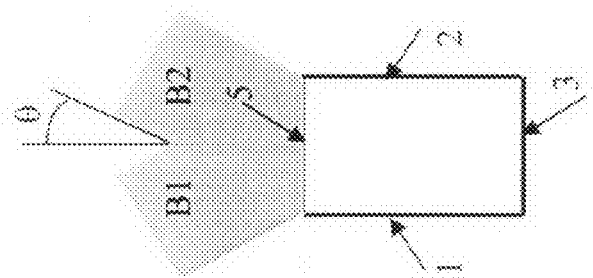
FIG. 2 a plan view of a Y-resonator

FIG. 2 presents the first embodiment of a device using the U-shaped mirror configuration. The first embodiment device is named the Y-resonator. The U-shaped mirror configuration geometrically encloses the gain medium of a laser oscillator. The gain medium is closed with a front longitudinal mirror 5 at the location of the virtual boundary 4. Mirror 5 is semi-transparent to allow for the partial radiation exit.

Reflections on all four mirrors determine closed optical paths characterized by the conditions:
$2k_z L = 2\pi p$ p is a positive longitudinal integer wave number
$2k_y w = 2\pi q$ q is a positive lateral integer wave number
To the wave number q corresponds a lateral wavelength $\Lambda_q$:

$$\Lambda_q = 2w/q \quad (2)$$

For each pair (m, n) there is a specific modal field configuration. At the exit mirror, all modes have pure sinusoidal field distributions. These distributions, at the interface between the gain medium and the lateral mirrors, ends with nodes in the case of π rad phase shift mirrors and with maxima in the case of 0 rad phase shift mirrors. At the exit mirror, plane waves start to propagate and in the far field they become two diffraction limited beams B1 and B2. These beams propagate in free space at angles θ given by $$\sin\theta = \pm\lambda/\Lambda_q \quad (3)$$

λ is the free space wavelength. The free space wavelength λ, the oscillation frequency ν and the free space speed of light c are related by relation $\lambda=c/\nu$.

The oscillation frequency ν and the free space λ can be selected by a gain-loss selection mechanism, for example with a Bragg reflector as the back mirror. The lateral wave number q can be selected by another gain-loss mechanism, for example a periodic gain with a lateral period $\Lambda_q$. For proper coupling of the selected, preferred mode, the periodic gain should have a period $P_{gain}$ given by:

$$P_{gain} = \Lambda_q/2 \quad (4)$$

The gain peaks should be located at the intensity maxima of the sinusoidal field distribution of the preferred mode.

In this embodiment there are essentially three light paths, one inside the U-shaped mirror configuration and two external, symmetrically inclined relative to the first one. These paths are arranged as a Y shape. That is why this resonator is named the Y-resonator.

If the gain-loss selectivity allows for multiple oscillating frequencies, then a pair of diffraction-limited beams will exit for each such frequency and for each lateral wave number q. The corresponding angles $\theta_q$ are given by $\sin\theta_q = \pm\lambda/\Lambda_q$.

The spread of exiting beam as a function of oscillating frequency suggest further types of resonators, with different enclosures for the U-shaped mirror configuration, as will be shown in further embodiments.

Figure 3:
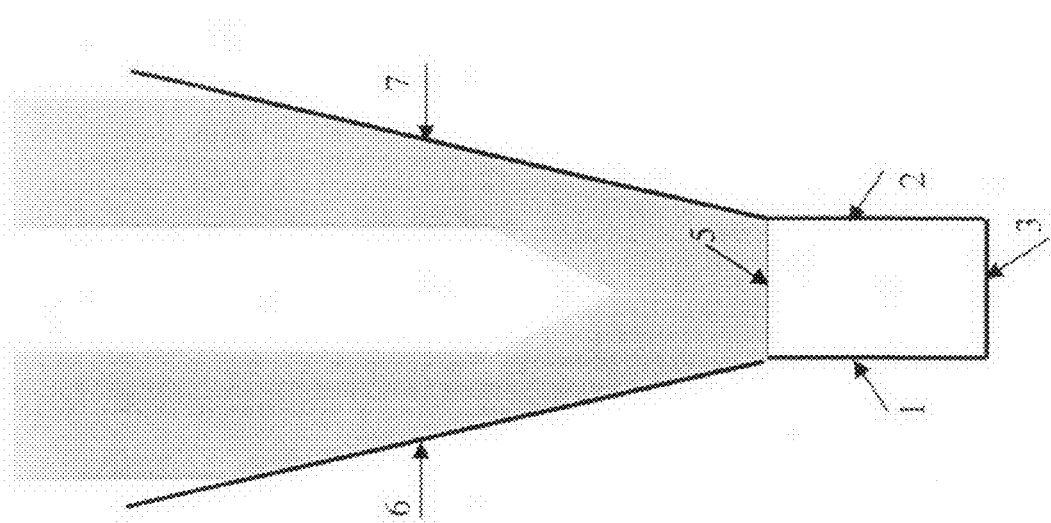
FIG. 3 is a plan view of a parallel rearrangement of two beams

As stated before the Y resonator has two diffraction-limited beams separated by 2θ angle. In FIG. 3 is presented simple optical system that uses two mirrors 6 and 7 to rearrange the beams parallel and close to each other. The resulting beam quality measured by the Beam Parameter Product is only 3 times larger than that of single diffraction limited beam.

The Second Embodiment

Figure 4:
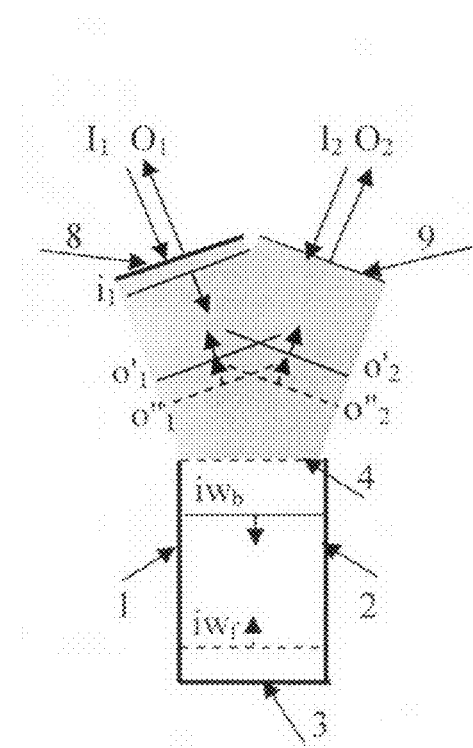
FIG. 4 a plan view of a $\hat{Y}$-resonator

FIG. 4 presents the second embodiment of a device using the U-shaped mirror configuration. The second embodiment device is named the Ŷ-resonator (accent Y resonator). The U-shaped mirror configuration geometrically encloses the gain medium of a laser oscillator. Optical paths are closed on one side with an inclined external mirror 8 and on the other side with an opposite inclined external mirror 9. Mirrors 8 and 9 capture and reflect back exactly in the same directions, the inclined plane wave beams of the U-shaped mirror configuration. The virtual boundary 4 can be replaced by a low reflectance mirror 5. In this case, between pair of mirrors (5, 3), (5, 8) and (5, 9) three coupled cavities are formed.

For each free space wavelength λ and for each lateral wave number q the U-shaped mirror configuration has two inputs $I_1$ and $I_2$ and two outputs $O_2$ and $O_2$ at the angles defined before $\sin\theta_{yq} = \pm\lambda/\Lambda_q$. A plane wave $i_1$ of finite extent at input $I_1$ reaching and exactly filling the aperture of the virtual boundary 4, separates in three parts: a reflected wave $o'_2$ toward the output $O_2$, one reflected $o'_1$ back toward the output $O_1$ and an inside wave $iw_b$ that couples with one of the modal configurations of the U-shaped mirror configuration. The $iw_b$ wave propagates longitudinally toward the back mirror 3. After reflection on mirror 3, the wave propagates forward as a wave $iw_f$. At the virtual boundary 4, the $iw_f$ wave separates in two waves $o''_1$ and $o''_2$ in directions $O_1$ and $O_2$. At each output there are now a pair of waves $(o'_1, o''_1)$ and $(o'_2, o''_2)$. Each pair interferes to form combined output waves $o_1$ an $o_2$ from the same input wave $i_1$. In the case of zero reflectance boundary 4, the complete relation between input and output waves is given by the S matrix as follows:

$$\begin{vmatrix} o_1 \\ o_2 \end{vmatrix} = S \begin{vmatrix} i_1 \\ i_2 \end{vmatrix} \quad S = \begin{vmatrix} r_b & r_f \\ r_f & r_b \end{vmatrix} \quad \begin{array}{l} r_f = -(1 + e^{j2kzL})/2 \\ r_b = -(1 - e^{j2kzL})/2 \end{array} \quad (5)$$

For L=0 $r_f$=−1 and $r_b$=0 and the S matrix represents the usual reflection with π rad phase change.

The U shaped mirror configuration together with the two external mirror 8 and 9 at angles ±θ form a resonator for modes characterized by the pair (λ, θ), whose oscillating frequency v=c/λ and the lateral wavelength $\Lambda_\theta$ are related by relation sin θ=λ/$\Lambda_\theta$. As stated before, from the multitude of modes satisfying this relation, a single mode can be further selected with a lateral periodic gain inside the U shaped mirror configuration with a period $P_{gain}=\Lambda_\theta/2$ and with gain maxima at the intensity maxima of the sinusoidal field distribution.

Transforming the S matrix into a T matrix and using the T matrix formalism, a threshold formula can be found for the $\hat{Y}$-resonator, which essentially consists of the three paths: an external path from the mirror 8 to the U-shaped mirror configuration, an internal path inside the U-shaped mirror configuration and a second external path from the U-shaped mirror configuration to the external mirror 9.

For practical uses the mirror 8 can have close to 100% reflectance and is called the return mirror, while mirror 9 can have close to 0% reflectance, including 0 reflectance and is called the output coupler. The T matrix analysis shows that the $\hat{Y}$-resonator has somewhat lower threshold then a Fabry-Perot resonator and also has lower slope efficiency. This can be explained by the semi-closed loop between the return mirror and the back mirror of the array cavity. This loop reduces the gain necessary for threshold but also reduces the power at the output coupler due to the absorption of the light traveling forth and back between the two high reflectance mirrors.

The $\hat{Y}$-resonator transforms the two diffraction-limited beams of a U shaped mirror configuration into a single diffraction limited beam.

The Third Embodiment

Figure 5:
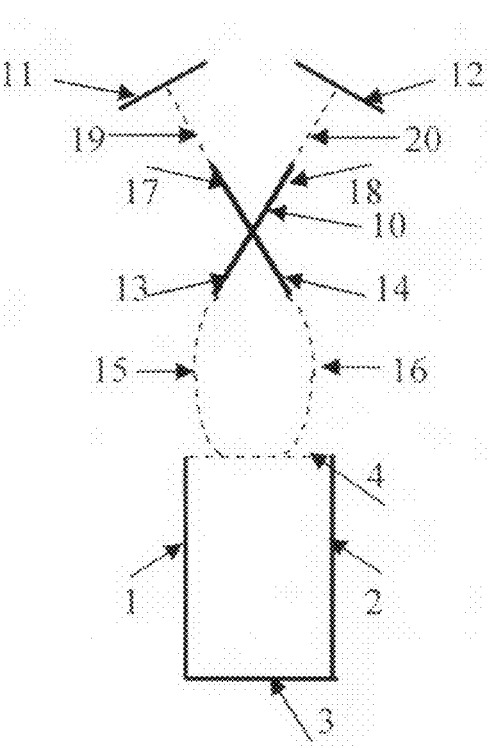
FIG. 5 is a plan view of an YX resonator

FIG. 5 presents the third embodiment of a device using the U-shaped mirror configuration. The third embodiment device is named the YX-resonator. The U-shaped mirror configuration geometrically encloses the gain medium of a laser oscillator. Optical paths are closed with an external 3 db coupler 10, an output coupler 11 and a full loss exit coupler 12. The two beams from the U-shaped mirror configuration are guided to the first two branches 13 and 14 of the 3 db coupler along two optical paths 15 and 16.

A 3 db coupler can be implemented in fiber optic design. It can be also implemented with a beam splitter such as a cube beam splitter.

The 3 db coupler essentially consists of four input-output branches. The easiest way to explain such type of coupler is to assume that, if two equal, coherent, in-phase beams enter two selected branches 13 and 14 the coherent addition exists at a third branch 17 and the null coherent subtraction exists at the forth branch 18. Other phase arrangements are possible and their effects on the operation of the resonator are similar. The 3 db coupler can have a shorthand representation as the X letter and its combination with the Y-resonator configuration can have the shorthand as the YX letters combination.

An optical path 19 exists between the X coupler branch 17 and the output coupler 11. Another optical path 20 exists between the X coupler branch 18 and the full loss exit coupler 12. In operation, the YX-resonator takes its feedback from the output coupler 11 through coupler branch 17. No feedback comes from the exit coupler 12 and coupler branch 18. In the return path of the X coupler, the feedback splits in two, equal-amplitude, coherent and in phase beams. These beams are conducted to the inputs of the U-shaped mirror configuration by the optical paths 15 and 16. Depending on the λ value, they might not arrive in phase. Nevertheless, for those particular λ values for which they arrive in phase, they entirely recombine as one mode of U-shaped mirror configuration, enter the gain medium, are amplified, reflected by the back mirror 3, amplified again and then split as two equal amplitude, coherent, in phase beams. The amplified beams enter in phase the X coupler at the branches 13 and 14, add coherently and exit at the branch 17 and the output coupler 11. In the operation as a laser oscillator, the particular λ values are automatically selected by the resonator since for these values the threshold is the lowest.

The YX-resonator transforms the two diffraction-limited beams of a U shaped mirror configuration into a single diffraction limited beam.

The Forth Embodiment

Figure 6:
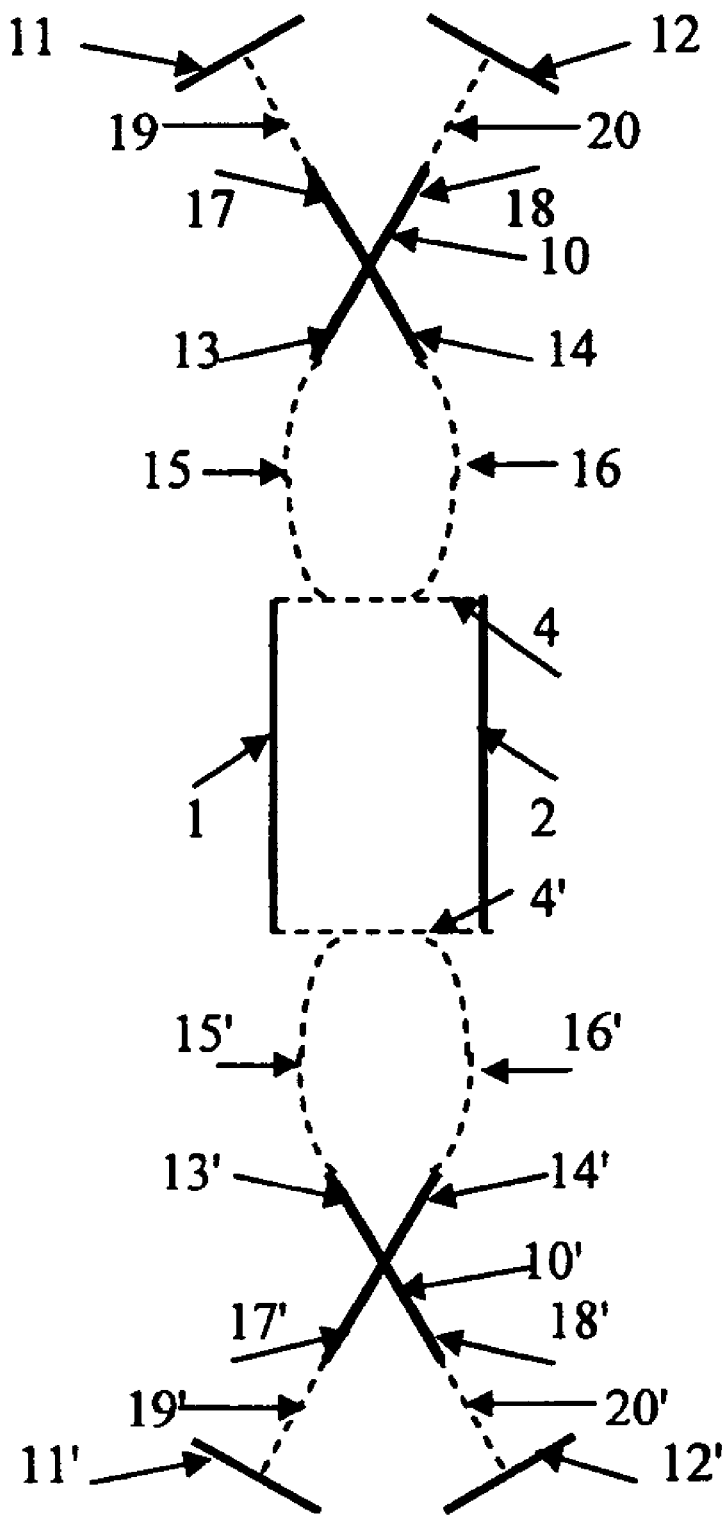
FIG. 6 is a plan view of a II shaped mirror configuration and an XYYX resonator

FIG. 6 shows the forth embodiment for a device of the present invention. It derives from the third embodiment and its proposed name is XYYX. In XYYX resonator the gain medium is geometrically enclosed by the II shaped mirror configuration, i.e. by two lateral mirrors 1 and 2 and has two virtual boundaries 4 and 4'. It is closed on one side with a 3 db coupler 10, an output coupler 11 and a full loss exit coupler 12 and on the other side with another 3 db coupler 10', another output coupler 11' and another full loss exit coupler 12'. The two beams at the virtual boundary 4 are guided to the first two branches 13 and 14 of the 3 db coupler along two optical paths 15 and 16. The two beams at the virtual boundary 4' are guided to the first two branches 13' and 14' of the 3 db coupler 10' along two optical paths 15' and 16'.

If at coupler 10, two equal, coherent, in-phase beams enter two selected branches 13 and 14 the coherent addition exits at a third branch 17 and the null coherent subtraction exits at the forth branch 18. Similarly at coupler 10', if two equal, coherent, in-phase beams enter two selected branches 13' and 14' the coherent addition exits at a third branch 17' and the null coherent subtraction exits at the forth branch 18'. An optical path 19 exists between the branch 17 of the coupler 10 and the output coupler 11. An optical path 19' exists between the branch 17' of the coupler 10' and the output coupler 11'. Another optical path 20 exists between the branch 18 of the coupler 10 and the full loss exit coupler 12. Another optical path 20' exists between the branch 18' of the coupler 20' and the full loss exit coupler 12'.

Without the output coupler 11 and 11', the XYYX arrangement is similar with an amplifier. A beam entering the branch 17' splits in to equal, coherent, in phase beams that exit at branches 13' and 14'. Guided by the optical paths 15' and 16' they enter the gain medium and couple with its sinusoidal preferred mode. After amplification the sinusoidal mode splits again in two beams. These beams are guided by the optical paths 15 and 16 to the branches 13 and 14 of the X coupler 10, add coherently and exit at the branch 17. The correct phasing after exiting the paths 15' and 16' or the paths 15 and 16 is not automatically reached in the amplifier mode of operation. The minimum threshold argument is still valid if output couplers 11 and 11' are added and the arrangement becomes an oscillator. The full loss couplers 12 and 12' are also necessary to avoid any undesired feedback.

With output couplers 11 and 11' added, the XYYX resonator is similar with the Fabry-Perot resonator. The difference consists in the fact that the spatial extension of the gain medium is much larger than that of a usual single mode Fabry-Perot oscillator.

The Fifth Embodiment

FIG. 7 shows another device according to invention. In front of the U shaped mirror configuration that encloses the periodic gain medium there is a grating coupler 25 and the output coupler 26. FIG. 8 shows schematically the grating coupler. The grating coupler is a wide waveguide that has two lateral mirrors 27 and 28, which continue and are aligned to the lateral mirrors of the U shaped mirror configuration, an input face 29 and output face 30. It has a width w equal to the width of the U shaped mirror configuration and a length $L_g$. The modes of the coupler have essentially the same lateral field distribution as the modes of the U shaped mirror configuration. The grating coupler has a grating 31 that induces an effective refractive index modulation $\Delta n$. This modulation that acts as a perturbation in the propagation of the grating coupler modes and performs the coupling from the input preferred mode q of the U shaped mirror configuration into the output fundamental mode 0. With proper adjustment of the grating parameters and of length $L_g$ there is a full conversion from one mode to the other.

The grating derives from a long period grating with period $\Lambda_g$ in the z direction. The period of a long period grating is related to the propagation constants in z direction $k_{qz}$ and $k_{0z}$ of the mode q and, respectively, mode 0. $k_{qz}$ and $k_{0z}$ are related to the lateral wavelength of these modes $\Lambda_q$ and $\Lambda_0$, where $\Lambda_q \ll \Lambda_0$. The following relations hold:

$$k_{0z}^2 = k^2 - (2\pi/\Lambda_0)^2 \quad (6)$$

$$k_{qz}^2 = k^2 - (2\pi/\Lambda_q)^2 \quad (7)$$

$$2\pi/\Lambda_g = k_{0z} - k_{qz} \quad (8)$$

$$\Lambda_g \approx 2n\Lambda_q^2/\lambda \quad (9)$$

Besides of the modulation of the effective refractive index in the z direction a modulation in the y direction is needed to enhance the coupling between otherwise two orthogonal modes. In the simplest form the $\Delta n$ modulation is:

$$\Delta n = \sin((2\pi/\Lambda_g)z)\sin((2\pi/\Lambda_q)y) \quad (10)$$

The first part is the long period grating modulation; the second part is the grating modulation with a spatial period equal to the spatial lateral period of the preferred mode $\Lambda_q$ and with the propagation constant equal to the preferred mode propagation constant $k_{qy} = 2\pi/\Lambda_q$. It can be noted that the sine product can be decomposed:

$$\sin((2\pi/\Lambda_g)z)\sin((2\pi/\Lambda_q)y) = \tfrac{1}{2}(\cos((2\pi/\Lambda_g)z - (2\pi/\Lambda_q)y) - \cos((2\pi/\Lambda_g)z + (2\pi/\Lambda_q)y)) \quad (11)$$

Two gratings 32 and 33 symmetrically inclined relative to the z direction can induce a modulation of this form, as shown in FIG. 8. The specific angles are given by $\tan(\theta) = \pm \Lambda_q/\Lambda_g$.

The modulated long period grating can operate with other periodic function that modulates the effective refractive index. These periodic functions have Fourier components that have spatial periods $\Lambda_{Fzi}$ and $\Lambda_{Fyi}$. The mode interaction will be determined by the matching Fourier components with periods $\Lambda_{Fzm}$ and $\Lambda_{Fym}$ that match the difference in propagation constants of the two modes as in relation (8) and the lateral $k_{qy}$ vector of the preferred mode.

Figure 9:
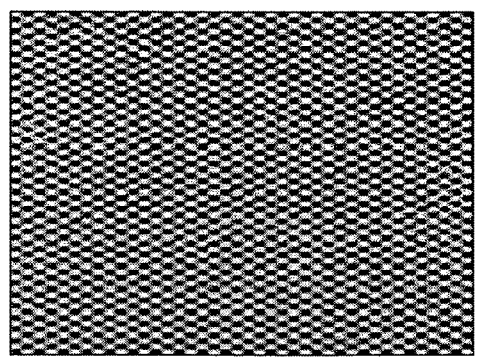
FIG. 9 is a plan view of a simulation of the grating modulation

The design of the properties of the gratings that modulate the effective refractive index in real 3D waveguide structure is the reverse process of the process that goes from a real 3D structure to 2D. In semiconductor real structures the gratings can be implemented by modulating the optical properties of a thin grating layer of the whole layered structure. In optical fibers the grating is usually implemented by changing the optical properties of Ge doped cores. For the ribbon like fiber a sensitive grating layer parallel with the claddings should be imprinted When modifying the grating layer, the imprinting of two inclined gratings as described by equation (11) should be the method of choice. The imprinted geometry should be similar to the image of FIG. 9, where the simulation of either the left or right side of relation (11) is presented. The simulation has a rather short $\Lambda_g$ to enhance the visual impression for two inclined gratings.

When the laser array and the grating coupler are in a hybrid design, either butt coupling or coupling intermediated by cylindrical lens can be used. In the latter case the grating coupler thickness in the transversal, x direction, can be thick and is determined by the requirements of lens intermediated transversal coupling between the laser array and the coupler. Thick couplers resemble a volume Bragg grating with two inclined gratings parallel to the x axis.

The last important parameter of the coupler is its length L. At a given L there is a certain wavelength $\lambda$ for which the q mode is fully transformed to the fundamental order mode. In conjunction with a spatial selector the grating coupler becomes also a wavelength selector. The simplest way to combine the grating selector with a spatial selector is to include the grating coupler in the laser resonator, between the U shaped mirror configuration and the external coupler. The maximum resonance is achieved for the q mode that is fully transformed to the fundamental mode. Another way is to focus the transformed mode into a pinhole. The q mode fully transformed to the fundamental mode has the maximum transfer through the pinhole.

The grating coupler can have the reverse functionality and act as a grating splitter when the fundamental mode enters one face and the preferred mode exit at the other face.

Figure 10:
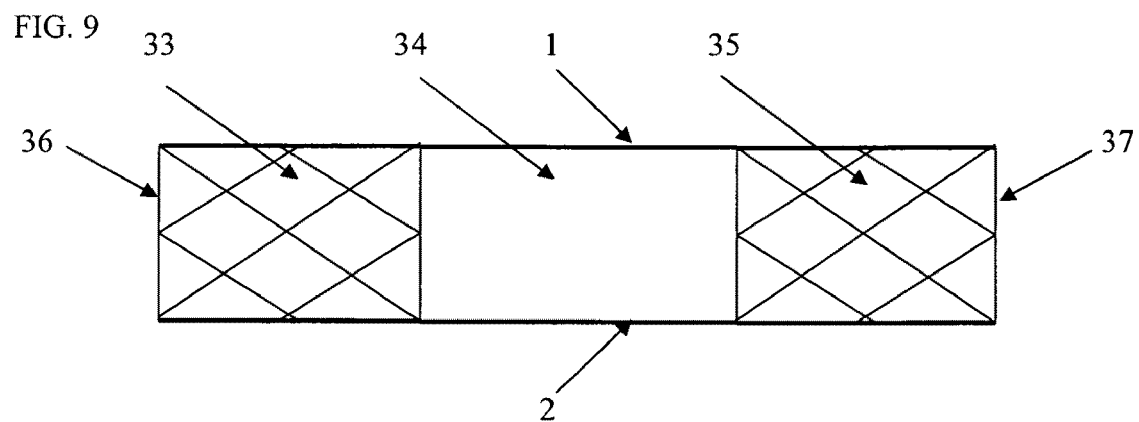
FIG. 10 is a plan view of a periodic gain media with a splitter and a coupler

FIG. 10 shows an arrangement of a device with a first grating coupler 33, which acts as a grating splitter, a gain medium 34, which has lateral mirror 1 and 2 and has not the back mirror 3, and a second grating coupler 35. This device has a fundamental mode input, a wide periodic gain medium for the propagation and amplification of the preferred mode and a fundamental mode output. If feedback is reduced by very low reflectivity of the external facets 36 and 37 of the first and second coupler, the device can operate as a laser amplifier. This amplifier can operate at high saturation output power due to its possible wide spatial extent.

Mirrors

As stated before, the principles of this invention are applied to layered structures such as epitaxial semiconductor layers and ribbon laser made for example from layered glass. The basic layered structure forms a planar waveguide that accept waves of the form given by (1). The lateral mirrors 1 and 2 are essential for reflecting back into the gain medium any wave that propagate at an angle relative to the longitudinal axis. In principle, the basic description is valid for both types of mirrors, lateral and longitudinal. The specificity for the case of lateral mirrors will be stressed when necessary.

Figure 11:
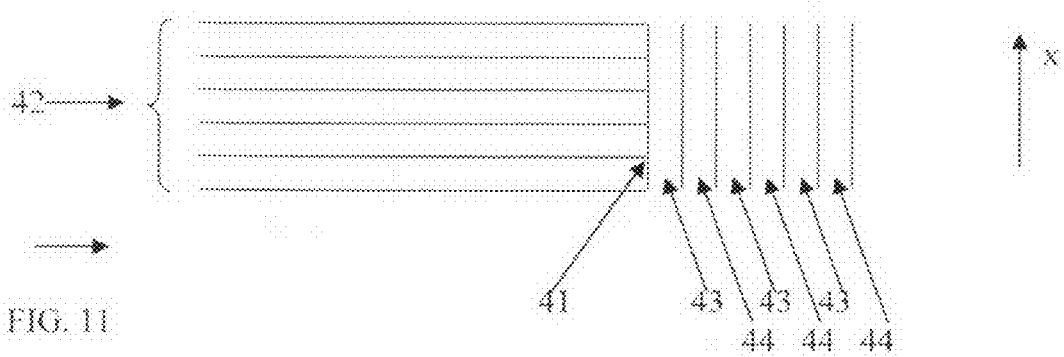
FIG. 11 is a plan view of an external stack mirror

FIG. 11 presents one type of mirror. This first type is an adjacent external stack mirror that is formed external to and adjacent to one facet 41 of the layered structure. Facet 41 is perpendicular to the basic layered structure 42. The mirror is formed by a quarter wavelength stack of secondary alternating layers 43 and 44, made of alternating optical materials with refractive index different from each other. The secondary layers are perpendicular to the basic layered structure. An external stack is usually not very selective mirror with regard to wavelength or incidence angle due to high contrast (difference) between the refractive indexes. Nevertheless, if the contrast is very small and the external stack has a very large number of layers, its selectivity increases and the name change to volume Bragg grating. Depending on the order of refractive index values of the stack materials, an external stack can induce a 0 or π phase shift. Otherwise said an external stack can pin a node or a maximum at the interface between gain medium and the mirror structure.

Figure 12:
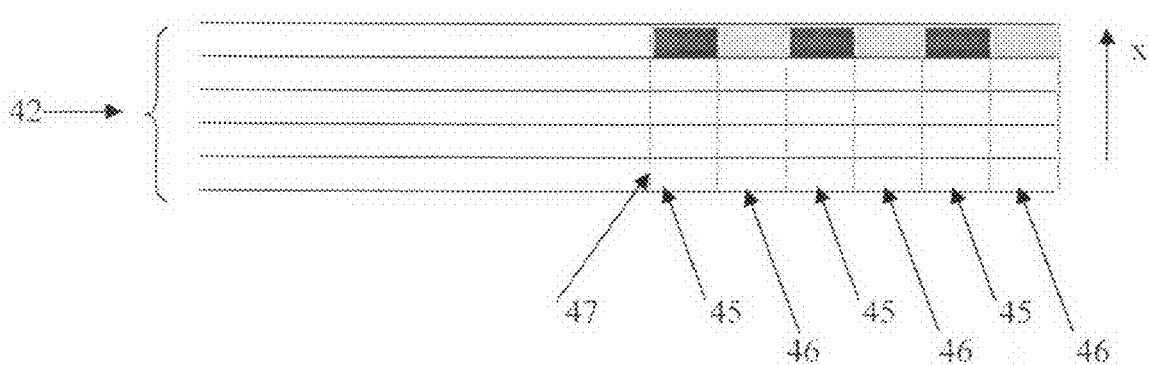
FIG. 12 is a plan view of an imprinted stack mirror

FIG. 12 presents another type of mirror. This type is an imprinted stack mirror that is formed internal to the layered structure 42, modifying one or a few layers. These modifications change the effective refractive index of the planar waveguide forming different segments 45 and 46 of the layered structure. In semiconductor chip manufacturing, imprinting is more usually named wafer processing. A new name is used to imagine processes that provide similar segment structures in the case of ribbons, which might be much longer and wider than a semiconductor chip. A virtual mirror face 47 separates the first segment from the layered structure 42 that has gain inside.

Alternating segments are parallel to virtual mirror face 47 and have different to each other effective refractive index. They are equal in width to a quarter of the lateral or longitudinal wavelength determined relative to the effective refractive index of the preferred mode. The lateral wavelength is defined for the lateral propagation $\Lambda_y = 2\pi/k_y$ and the longitudinal wavelength is defined for the longitudinal propagation $\Lambda_z = 2\pi/k_z$. These alternating segments form the imprinted stack. If an imprinted stack has a small contrast in the effective refractive index and has a larger number of segments it is more selective mirror with regards to wavelength and angle of incidence. In this case it is called a (imprinted) Bragg grating. Depending on the order of effective refractive index values of the alternating segments, an imprinted stack can induce a 0 or π phase shift. Otherwise said an imprinted stack can pin a node or a maximum at the separation line between the layered structure and the first stack segment.

There is not a sharp distinction between imprinted stacks and (imprinted) Bragg gratings since their functionality is the same. Nevertheless the distinction is necessary for practical reasons associated with segments widths. The U shaped mirror configuration of this invention works best with a periodic gain inside the planar waveguide. The gain elements are parallel to the lateral mirrors. As stated before the gain period is half the lateral wavelength of the selected, preferred mode. Due to material processing constraints, the preferred mode lateral wavelength $\Lambda_q$ is approximately one order of magnitude larger than the free space wavelength λ, while its longitudinal wavelength is of the same order of magnitude with λ/n. A lateral imprinted Bragg grating will have necessarily very wide segments, making the total width of the grating exceedingly wide. A longitudinal imprinted Bragg grating is of reasonable extent. An imprinted stack, with large contrast of the effective refractive index of its segments and with wider segments, is a good, but less selective, reflector.

Figure 13:
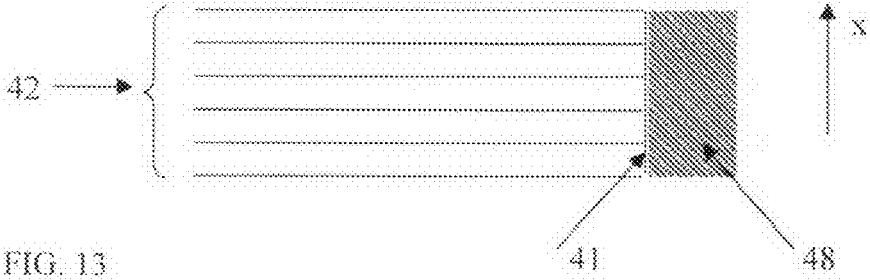
FIG. 13 is a plan view of a metallic mirror

FIG. 13 presents still another type of mirror. This mirror is a metallic mirror that simply has a flat metal surface 48 on the face 41 of the layered structure 42.

Figure 14:
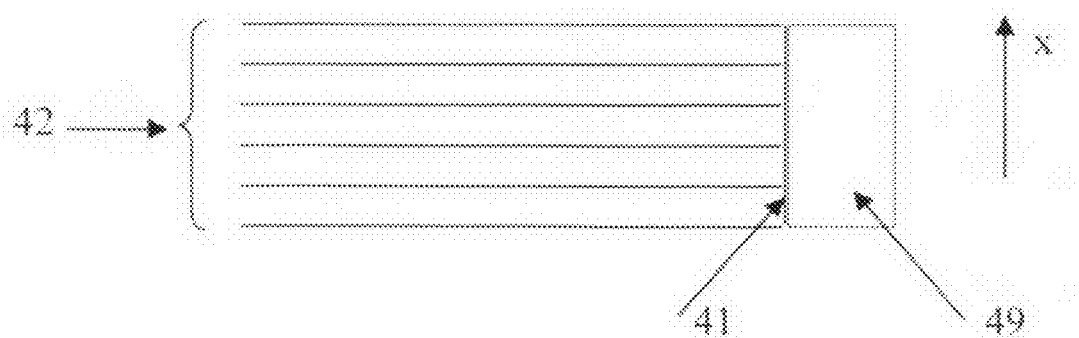
FIG. 14 is a plan view of two optical materials mirror

FIG. 14 presents still another type of mirror. This is the two optical materials mirror and is the interface between the layered structure 42 and the material 49 (or lack of it) in outside space. This type of mirror can induce total reflection at large incidence angles.

Figure 15:
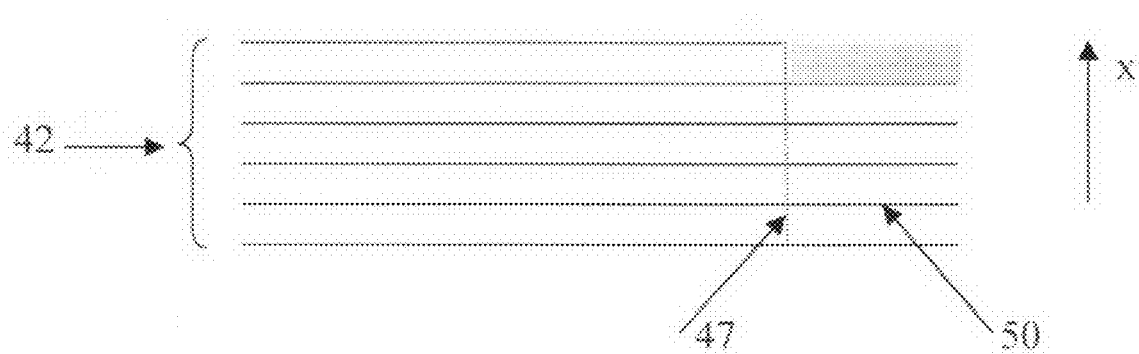
FIG. 15 is a plan view of an imprinted total reflection mirror

FIG. 15 presents still another type of mirror. This is the imprinted total reflection mirror. This is made by modifying in the main layered structure 42 one or a few layers to form a segment 50 in such a way that segment 50 effective refractive index is smaller than the effective refractive index of the preferred mode in the structure 42. The structure 42 and the segment 50 are separated by a virtual mirror face 47. The preferred mode propagating in structure 42 and arriving at face 47, evanescently decay in segment 50.

Mirrors presented in FIGS. 11 to 15 are mirror adjacent to main device gain medium. As described before, most of the embodiments need also external mirrors. They can by metallic, dielectric-stack, volume Bragg gratings and diffraction gratings in Littrow arrangement. Before reaching the mirror, the light emerging from the virtual boundary 4 or the semitransparent mirror 5, should be collimated with a Fast Axis Collimator (FAC) cylindrical lens. The FAC lens can be avoided, for example, if the return mirror 8 in the second embodiment is replaced by an inclined imprinted Bragg grating in the same, extended, integrated, transversal waveguide. In the same idea of keeping the light confined in the transversal waveguide, external stack mirrors can be deposited on facets that are inclined relative to the main axis of an extended waveguide. In the case of inclined facets, the well-known advantage of using cleaved facets is lost.

After reviewing the main type of mirrors, it is useful to make an assessment on where each of them works best.

As lateral mirrors, the high contrast, short imprinted stack, the imprinted total reflection mirror and the metallic mirror are the mirrors of choice.

The high contrast, short imprinted stacks are designed for rather large lateral wavelengths $\Lambda_q$. The stack segments lateral dimensions are greater than λ and it is possible to implement them with good accuracy with standard wafer processing tools.

The imprinted total reflection mirror is the easiest to implement since does not require geometrical definition of small segments with implied accuracy. They require nevertheless, good alignment relative to the periodic gain at predetermined locations.

The imprinted type of mirrors fit semiconductor material lasers since imprinting (i.e wafer processing) is well developed for these materials.

For ribbon laser, which can be much longer and wider than a semiconductor laser chip, wafer processing is not a good choice. The metallic lateral mirrors become a good choice and they are not so exposed to damage as in the back (or front) mirror case.

The two optical material mirror would be usable if they provide total reflection for the preferred mode and in the same time, together with longitudinal mirrors, can reject the cross modes. A cross mode is that mode that can have total reflections at all mirrors of the U-shaped mirror configuration, including the, otherwise semitransparent, mirror 5 (or totally transparent boundary 4).

The high contrast stack is less desirable as lateral mirror. Even for a low number of segments, the stack width can be considerable large and the radiation exiting at a non zero transversal angle do not return into the main planar waveguide. Nevertheless it might be useful if the exiting transversal angle is rather low.

Due the large spatial extension exacerbated by large lateral wavelengths, both types of Bragg grating are not desirable, even in the case of the imprinted Bragg grating, where the radiation travels in the same main planar waveguide.

As back mirror, the external adjacent, high contrast, short stack and the imprinted Bragg grating are the mirrors of choice.

The short stack has good reflectance for the radiation guided in the planar waveguide. A wider stack that becomes by name a volume Bragg grating loses some of the radiation exiting the planar waveguide with a non zero transversal angle. Nevertheless, a volume Bragg grating can be used in conjunction with Fast Axis Collimator cylindrical lens, if associated alignment problems are overcome. (This is an external arrangement.)

An imprinted Bragg grating is a good choice since it has not the disadvantage of diffraction radiation loss since the radiation does not leave the main transversal planar waveguide.

Bragg gratings, imprinted or external, have the advantage of the wavelength and, implicitly, angle selection.

Metal mirrors should be avoided due to the expected high field intensity that might destroy them.

Two optical materials usually have a reflectance much lower than 100%. Since the radiation propagates especially at small incidence angle relative to the back mirrors, they can not be used in the total reflection mode.

I claim:

1. A laser device that comprises:
   a rectangular enclosure of a gain medium that has two lateral mirrors, said gain medium being periodic in a lateral direction perpendicular to the said lateral mirrors, its period being related to the properties of a preferred mode, said preferred mode being one of the plane waves that can propagate in the said rectangular enclosure, said plane waves having stationary sinusoidal wave components in the lateral direction due to reflection on said lateral mirrors, said lateral component of the said preferred mode having a lateral wavelength which is twofold the period of said periodic gain and the maxima of the said periodic gain medium being situated at the intensity maxima of the stationary sinusoidal field distribution of the lateral component of the said preferred mode
   a back mirror perpendicular to the lateral mirrors, which together with the lateral mirrors forms an U-shaped mirror configuration,
   a semitransparent, low reflectivity front boundary that connects the arm's ends of the said U-shaped mirror configuration and together with the said U-shaped mirror configuration is closing the said rectangular enclosure
   and optical means situated externally to said front boundary to longitudinally close a resonator together with the said back mirror
   such that the said preferred mode couples with the said periodic gain medium, the maxima of the said periodic gain medium being situated at the intensity maxima of the stationary sinusoidal field distribution of the lateral component of the said preferred mode
   such that at the said front boundary the said sinusoidal field distribution of the said preferred mode is transformed in two outputs consisting of two beams emerging from said sinusoidal field distribution, said beams being symmetrically inclined relative to the normal to the said front boundary
   and such that said optical means situated externally to the said front boundary transform the two beams emerging from said sinusoidal field distribution into a single beam, close to a diffraction limited beam.

2. Optical means according to claim 1 situated externally to said front boundary to longitudinally close a resonator together with the said back mirror that comprise an inclined return mirror situated perpendicular to a first one of said output beams of the said preferred mode
   such that the first of the two beams of the far field of the said preferred mode that exit the said front boundary is returned back by the said inclined return mirror into the arms of the said U-shaped mirror configuration, and a resonator's optical paths is closed between the said inclined return mirror and the said back mirror and
   such that useful single beam, close to a diffraction limited beam, exits in the direction of the second inclined output beam of the said preferred mode that exit the said virtual front boundary.

3. A laser device according to claim 2 that comprises an output coupler situated perpendicular to the second of said output beams of the far field of the said preferred mode.

4. Optical means according to claim 1 situated externally to the said front boundary to longitudinally close a resonator together with the said back mirror comprising
   a 3 db coupler which has two inputs and two outputs and which is connected at its inputs with said two inclined output beams from the said boundary
   a full loss exit coupler that is coupled with a first 3 db coupler's output
   an output coupler that is coupled with a second 3 db coupler's output and which is partially reflecting
   guiding optical means to direct radiation from the said outputs of the boundary to the said inputs of the said 3 db coupler and from the said outputs of the said 3 db coupler to the said full loss coupler and to the said output coupler
   such that for a particular wavelength of the said preferred mode beams exiting from the said first output of the 3 db coupler and interacting with the said full loss coupler coherently subtract and the beams exiting from the said second output of the said 3 db coupler coherently add
   such that feedback for the said preferred mode is given by the radiation reflected back by the said output coupler which is splitted by the said 3 db coupler and recombined as the said sinusoidal field distribution of the said preferred mode at the said boundary of the said U-shaped mirror configuration
   and such that useful single beam, close to a diffraction limited beam, exits from the said output coupler.

5. Optical means according to claim 1 situated externally to the said front boundary to longitudinally close a resonator together with the said back mirror that comprise
   a grating coupler-splitter next to the said front boundary that comprises two splitter's parallel lateral mirrors that have the same lateral spatial extent as the said rectangular enclosure of the laser device, are aligned with the parallel lateral mirrors of the said rectangular enclosure of the laser devices and have the same lateral modes as the said rectangular enclosure of the laser devices that has a longitudinal modulation of the refractive index with a Fourier component whose propagation constant matches the difference of the propagation constants of the fundamental mode propagating laterally between said two parallel lateral mirrors and of said the preferred mode and that has a lateral modulation of the refractive index with a lateral periodic function that has a spatial Fourier component whose period matches the lateral spatial period of the said preferred mode and an output coupler such that said sinusoidal field distribution of the said preferred mode entering the said grating coupler-splitter exits after a complex diffraction process as the said fundamental mode such that the laser feedback is obtained from the partial reflection from the said output coupler and such that useful single beam, close to a diffraction limited beam, exits from the said output coupler.

6. A laser device that comprises:

a rectangular enclosure of a gain medium that has two lateral mirrors, said gain medium being periodic in a lateral direction perpendicular to the said lateral mirrors, its period being related to the properties of a preferred mode, said preferred mode being one of the plane waves that can propagate in the said rectangular enclosure, said plane waves having stationary sinusoidal wave components in the lateral direction due to reflection on said lateral mirrors, said lateral component of the said preferred mode having a lateral wavelength which is two-fold the period of said periodic gain and the maxima of the said periodic gain medium being situated at the intensity maxima of the stationary sinusoidal field distribution of the lateral component of the said preferred mode a semitransparent, low reflectivity back boundary that connects the back arm's ends of the said parallel lateral mirrors where the said sinusoidal field distribution of the preferred mode can be entered at the back boundary by the coherent recombination of two equally and property inclined beams a semitransparemt, low reflectivity front boundary that connects the front arm's ends of the said parallel lateral mirrors where from the said sinusoidal field distribution of the preferred mode two equally inclined beam can emerge such that the two parallel lateral mirrors, the back boundary and the front boundary close the said rectangular enclosure input optical means situated externally to the said back boundary to allow a single beam input to be transformed into the said sinusoidal field distribution of the preferred mode and to propagate inside of the said rectangular enclosure as the said preferred mode and output optical means situated externally to the said front boundary to allow the said sinusoidal field distribution of the preferred mode to be transformed and to exit as a single beam output such that the said preferred mode propagate longitudinally in the said rectangular enclosure and couples with the said periodic gain medium, the maxima of the said periodic gain medium being situated at the intensity maxima of the stationary sinusoidal field distribution of the lateral component of the said preferred mode.

7. Input optical means according to claim 6, situated externally to said back boundary to allow a single beam input to be transformed into the said sinusoidal field distribution of said the preferred mode and to propagate inside of the said rectangular enclosure as the said preferred mode, that comprises a 3 db coupler which has two inputs and two outputs and which is connected at its outputs to said two inclined input beams of the said back boundary a full loss coupler that is coupled with a first 3 db coupler's input an input coupler that is coupled with a second 3 db coupler's input guiding optical means to direct radiation from the said inputs of the back boundary to the said outputs of the said 3 db coupler and from the said inputs of the said 3 db coupler to the said full loss coupler and to the said input coupler such that for a particular wavelength of the preferred mode the beams entering from the said input coupler to second input of the said 3 db coupler equally split in two coherent beams in the said 3 db coupler outputs and form a sinusoidal field distribution at the said back boundary of the said rectangular enclosure.

8. Input optical means according to claim 6, situated externally to the said back boundary to allow a single beam input to be transformed and propagate inside of the said rectangular enclosure as the said preferred mode, that comprises a grating coupler-splitter next to the said front boundary that comprises two splitter's parallel lateral mirrors that have the same lateral spatial extent as the said rectangular enclosure of the laser device, are aligned with the parallel lateral mirrors of the said rectangular enclosure of the laser devices and have the same lateral modes as the said rectangular enclosure of the laser devices that has longitudinal modulation of the refractive index with a Fourier component whose propagation constant matches the difference of the propagation constants of the fundamental mode propagating laterally between said two parallel lateral mirrors and of said the preferred mode and that has a lateral modulation of the refractive index with a lateral periodic function that has a spatial Fourier component whose period matches the lateral spatial period of the said preferred mode and an input coupler such that half cosine field distribution of the said fundamental mode entering the said input coupler exits after a complex diffraction process as the said preferred mode of the rectangular enclosure.

9. Output optical means according to claim 6, situated externally to the said front boundary to allow a sinusoidal field distribution beam output to be transformed and to exit as a single beam, that comprises a 3 db coupler which has two outputs and two inputs and which is connected at its inputs with two inclined output beams of the said front boundary a full loss coupler that is coupled with a first 3 db coupler's output an output coupler that is coupled with a second 3 db coupler's output guiding optical means to direct radiation from the said output beams of the front boundary to the said inputs of the said 3 db coupler and from the said outputs of the said 3 db coupler to the said full loss coupler and to the said output coupler such that for a particular wavelength of the preferred mode the beams exiting from the said first output of the 3 db coupler and interacting with the said full loss coupler coherently subtract and the beams exiting from the said second output of the said 3 db coupler coherently add and such that useful single beam, close to a diffraction limited beam, exits from the said output coupler.

10. Output optical means according to claim 6, situated externally to the said front boundary to allow the said sinusoidal field distribution of the said preferred mode to be transformed and to exit as a single beam output, that includes a grating coupler-splitter next to the said front boundary that comprises two splitter's parallel lateral mirrors that have the same lateral spatial extent as the said rectangular enclosure of the laser device and are aligned with the parallel lateral mirrors of the said rectangular enclosure of the laser devices and have the same lateral modes as the said rectangular enclosure of the laser devices that has a longitudinal modulation of the refractive index with a Fourier component whose propagation constant matches the difference of the propagation constants of the fundamental mode propagating laterally between said two parallel lateral mirrors and of said the preferred mode and that has a lateral modulation of the refractive index with a lateral periodic function that has a spatial Fourier component whose period matches the lateral spatial period of the said preferred mode and an output coupler such that said sinusoidal field distribution of the said preferred mode emerging from said front boundary, after a complex diffraction process, exits said grating coupler-splitter through the output coupler as the said fundamental mode of the rectangular enclosure.

11. Input optical means according to claim 7 that have very low reflectivity input couplers and output optical means that have very low reflectivity output couplers to obstruct the laser oscillation between input and output.

\* \* \* \* \*